(12) United States Patent
Tao et al.

(10) Patent No.: US 8,194,495 B2
(45) Date of Patent: Jun. 5, 2012

(54) CLOCK GENERATORS, MEMORY CIRCUITS, SYSTEMS, AND METHODS FOR PROVIDING AN INTERNAL CLOCK SIGNAL

(75) Inventors: Derek C. Tao, Fremont, CA (US); Chung-Ji Lu, Fongyuan (TW); Annie-Li-Keow Lum, San Jose, CA (US)

(73) Assignee: Taiwan Semiconductor Manufacturing Company, Ltd.

( * ) Notice: Subject to any disclaimer, the term of this patent is extended or adjusted under 35 U.S.C. 154(b) by 269 days.

(21) Appl. No.: 12/723,077

(22) Filed: Mar. 12, 2010

(65) Prior Publication Data

US 2010/0246311 A1    Sep. 30, 2010

Related U.S. Application Data

(60) Provisional application No. 61/164,019, filed on Mar. 27, 2009.

(51) Int. Cl.
*G11C 8/00* (2006.01)
(52) U.S. Cl. ........... 365/233.1; 365/233.11; 365/233.12; 365/233.5

(58) Field of Classification Search ................ 365/233.1, 365/233.11, 233.12, 233.5, 189.07
See application file for complete search history.

(56) References Cited

U.S. PATENT DOCUMENTS

| 5,815,462 | A * | 9/1998 | Konishi et al. | 365/233.11 |
| 6,864,735 | B2 * | 3/2005 | Joo | 327/298 |
| 6,928,007 | B2 * | 8/2005 | Jin | 365/194 |

* cited by examiner

*Primary Examiner* — Son Dinh
(74) *Attorney, Agent, or Firm* — Lowe Hauptman Ham & Berner, LLP

(57) ABSTRACT

A clock generator includes a first input end and a second input end. The first input end is capable of receiving a first clock signal including a first state transition and a second state transition defining a first pulse width. The second input end is capable of receiving a second clock signal having a third state transition. A time period ranges from the first state transition to the third state transition. The clock generator can compare the first pulse width and the time period. The clock generator can output a third clock signal having a second pulse width ranging from a fourth state transition to a fifth state transition. The fifth state transition of the third clock signal is capable of being triggered by the second state transition of the first clock signal or the third state transition of the second clock signal depending on the comparison of the first pulse width and the time period.

19 Claims, 5 Drawing Sheets

CLOCK GENERATORS, MEMORY CIRCUITS, SYSTEMS, AND METHODS FOR PROVIDING AN INTERNAL CLOCK SIGNAL

CROSS-REFERENCES TO RELATED APPLICATIONS

The present application is based on, and claims priority from, U.S. Provisional No. 61/164,019 filed Mar. 27, 2009, the disclosure of which is hereby incorporated by reference herein in its entirety.

TECHNICAL FIELD

The present disclosure relates generally to the field of semiconductor circuits, and more particularly, to clock generators, memory circuits, systems, and methods for providing an internal clock signal.

BACKGROUND

Memory circuits have been used in various applications. Conventionally, memory circuits can include DRAM, SRAM, and non-volatile memory circuits. A SRAM circuit includes a plurality of memory cells. For a conventional 6-T static memory in which arrays of memory cells are provided, each of the memory cells consists of six transistors. The 6-T SRAM memory cell is coupled with a bit line BL, a bit line bar BLB, and a word line. Four of the six transistors form two cross-coupled inverters for storing a datum representing "0" or "1". The remaining two transistors serve as access transistors to control the access of the datum stored within the memory cell.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
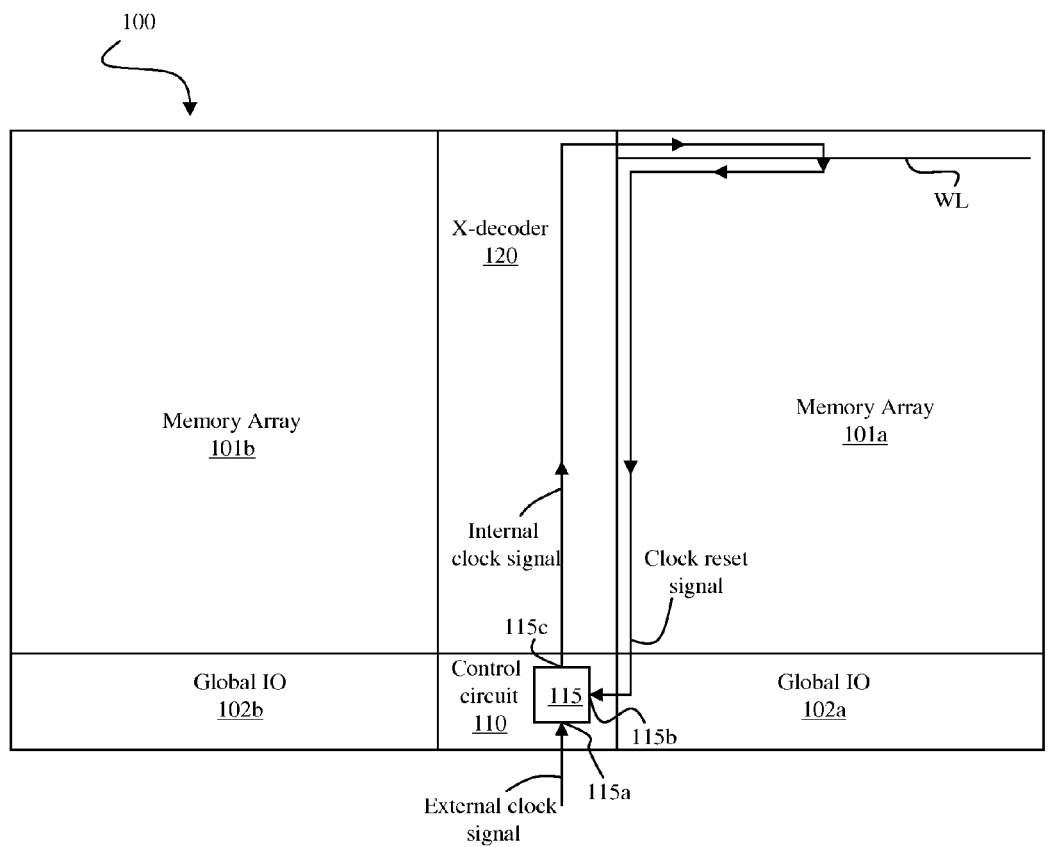
FIG. 1 is a schematic drawing illustrating an exemplary memory circuit.

The conventional SRAM circuit has a pulse generator. The pulse generator receives an external clock signal, outputting an internal clock signal for accessing data of the SRAM circuit. Generally, state transitions of the external clock signal trigger state transition of the internal clock signal. In other word, a variation of the pulse width of the external clock signal can change a pulse width of the internal clock signal. Conventionally, when the memory operates at its optimized speed, the pulse width of the internal clock signal is larger than the pulse width of the external clock signal due to a signal processing delay within the pulse generator and/or a signal transmission delay within the pulse generator.

Conventionally, the pulse width of the internal clock signal is configured to, for example, provide a high voltage to a word line of the SRAM circuit. The charged word line can turn on memory cells coupled thereto for reading and/or writing data stored within the memory cells. As noted, the SRAM circuit is designed and developed for a high-speed operation. It is found that during the high-speed operation the pulse width of the external clock signal becomes narrow that in turn narrows the pulse width of the internal clock signal. The short pulse width of the internal clock signal may not provide a desired time to charge and/or keep the high voltage of the word line. The word line may not have the desired voltage and/or time to turn on the memory cells of the conventional SRAM circuit. Accessing the data of the conventional SRAM circuit may fail.

To prevent the issue described above, a conventional SRAM circuit using another pulse generator is provided. In addition to receiving the external clock signal, the pulse generator receives a clock reset signal. The clock reset signal is provided to trigger the internal clock signal transitioning from high to low to reset the clock cycle of the internal clock signal. The high-to-low transition of the internal clock signal defines the pulse width of the internal clock signal. Conventionally, the pulse width of the internal clock is a constant and independent from the variation of the pulse width of the external clock signal. Even if the external clock has a short pulse width, the constant pulse width of the internal clock can charge and/or keep the high voltage of the word line for a desired time for accessing the data of the SRAM circuit.

However, it is found that if the power of the SRAM circuit runs out or SRAM operates at a low voltage application, an internal voltage supplied to the SRAM circuit goes low. Due to the low operating voltage, the operating speed of the SRAM circuit becomes slow. The pulse width of the external clock signal thus becomes large. As noted, the pulse width of the internal clock signal is determined by the clock reset signal and independent from the variation of the pulse width of the external clock signal. The internal clock signal may be reset before data signals of the SRAM circuit are sensed and/or latched. Since the data signals are not desirably sensed and/or latched, accessing the data stored within the SRAM circuit fails.

Based on the foregoing, clock generators, memory circuits, systems, and method for providing a desired pulse width of the internal clock signal are desired.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic drawing illustrating an exemplary memory circuit. In FIG. 1, a memory circuit 100 can include at least one memory array, e.g., memory arrays 101a and 101b, at least one Global input/output (IO), e.g., Global IOs 102a and 102b, a control circuit 110, and an X-decoder 120. The control circuit 110 can be coupled with the Global IOs 102a-102b and the X-decoder 120. The memory arrays 101a and 101b can be coupled with the X-decoder 120 and the Global IOs 102a and 102b, respectively.

In some embodiments, each of the memory arrays 101a and 101b can include a plurality of word lines WLs and a plurality of bit lines BLs and BLBs. In some embodiments, the memory array 101a and 101b can include a static random access memory (SRAM) array, an embedded SRAM array, dynamic random access memory (DRAM) array, an embedded DRAM array, a non-volatile memory array, e.g., FLASH, EPROM, E²PROME, a field-programmable gate array, a logic circuit array, and/or other memory array.

In some embodiments, the Global IOs 102a and 102b can be coupled with the memory arrays 101a and 101b, respectively. The Global IOs 102a and 102b can be configured to sense and/or output data stored within the memory arrays 101a and 101b. The control circuit 110 can be configured to provide signals controlling the Global IOs 102a-102b and/or the X-decoder 120 for accessing the data stored within the memory arrays 101a-101b. The X-decoder 120 can decode signals sent from the control circuit 110 to selectively control the word lines WLs.

Referring to FIG. 1, the control circuit 100 can include a clock generator 115. The clock generator 115 is capable of receiving a first clock signal, e.g., an external clock signal, and a second clock signal, e.g., a clock reset signal, outputting a third clock signal, e.g., an internal clock signal. The internal clock signal is provided to, for example, the X-decoder 120 for accessing, e.g., reading or writing, data stored within the memory arrays 101a and 101b. The clock reset signal can be provided to reset the clock cycle of the internal clock signal. In some embodiments, the clock reset signal have a pulse width substantially equal to that of the internal clock signal. The clock reset signal and the internal clock signal may have a time difference. In some embodiments, the time difference can be referred to as a tracking delay time. In some embodiments, the tracking delay time can include a tracking time of the internal clock signal from a pre-decoder (not shown) to the X-decoder 120, a word line tracking time, a local bit line tracking time, a global bit line tracking time, other tracking times of the internal clock signal, and/or any combinations thereof.

Referring again to FIG. 1, the clock generator 115 can have a first input end, e.g., input end 115a, and a second input end, e.g., input end 115b. The input end 115a is capable of receiving a first clock signal, e.g., the external clock signal. The input end 115b is capable of receiving a second clock signal, e.g., the clock reset signal. The clock generator 115 can have an output end, e.g., output end 115c, for outputting a third clock signal, e.g., the internal clock signal.

Figure 2:
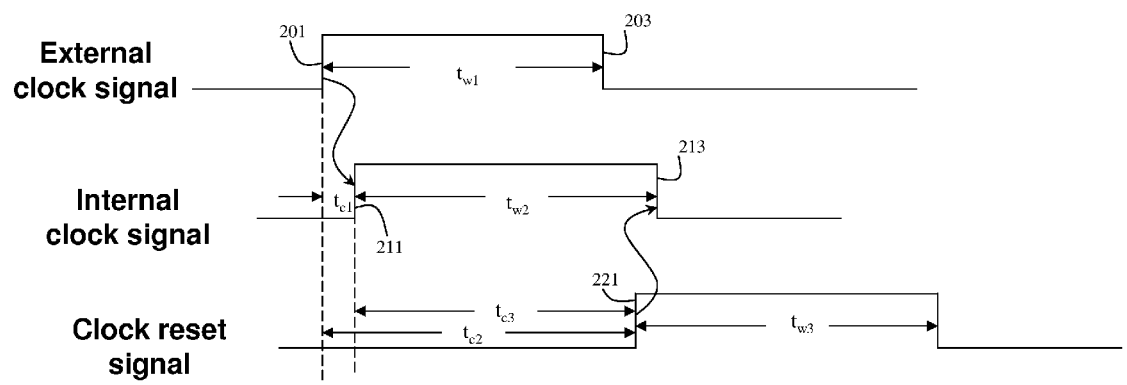
FIG. 2 is a drawing illustrating state transitions of the external clock signal, the internal clock signal, and the clock reset signal during a high-speed operation.

Following is a description regarding an exemplary high-speed operation of the clock generator 115. FIG. 2 is a drawing illustrating state transitions of the external clock signal, the internal clock signal, and the clock reset signal during a high-speed operation. In FIG. 2, the external clock signal can have a pulse width $t_{w1}$. The internal clock signal can have a pulse width $t_{w2}$. The clock reset signal can have a pulse width $t_{w3}$.

For some embodiments having an operating speed of about 1 GHz, the external clock signal can include a first state transition, e.g., state transition 201 from low to high, and a second state transition, e.g., state transition 203 from high to low. The pulse width $t_{w1}$ can range from the state transition 201 to the state transition 203. The state transition 201 of the external clock signal can trigger a state transition 211, e.g., from low to high, of the internal clock signal. A time difference $t_{c1}$ can be between the state transition 201 of the external clock signal and the state transition 211 of the internal clock signal. In some embodiments, the time difference $t_{c1}$ can be a constant.

The clock reset signal can have a third state transition, e.g., a state transition 221 from low to high. A time period $t_{c2}$ can range from the state transition 201 of the external clock signal to the state transition 221 of the clock reset signal. As noted, the state transition 211 of the internal clock signal and the state transition of the clock reset signal 221 can have a tracking delay time $t_{c3}$. In some embodiments, the tracking delay time $t_{c3}$ can be a constant.

The clock generator 115 can compare the pulse width $t_{w1}$ and the time period $t_{c2}$. As shown in FIG. 2, the time period $t_{c2}$ is larger than the pulse width $t_{w1}$. The state transition 221 of the clock reset signal can directly or indirectly trigger a state transition 213, e.g., from high to low, of the internal clock signal for resetting the clock cycle of the internal clock signal. In some embodiments, the clock generator 115 can output the internal clock signal having a pulse width $t_{w2}$ substantially equal to the time period $t_{c2}$. In other embodiments, the time period $t_{c2}$ can be a constant. In still other embodiments, the time period $t_{c2}$ can be substantially equal to the sum of the time periods $t_{c1}$ and $t_{c3}$. The time period $t_{c2}$ can include the tracking delay time $t_{c3}$ between the state transition 211 of the internal clock signal and the state transition 221 of the clock reset signal. In some embodiments, the pulse width $t_{w1}$ of the external clock signal is substantially equal to the time period $t_{c2}$ of the clock reset signal. Under these circumstances, either the state transition 203 or the state transition 221 can trigger the state transition 213.

As noted, the clock generator 115 operates at the high speed. Since the time period $t_{c2}$ is larger than the pulse width $t_{w1}$, the state transition 221 of the clock reset signal can desirably trigger the state transition 213 of the internal clock signal, resetting the internal clock signal. The state transition 213 triggered by the state transition 221 can define the pulse width $t_{w2}$. Since the state transition 213 of the internal clock signal is independent from the transition 203 of the external clock signal, the pulse width $t_{w2}$ of the internal clock signal is independent from the variation of the pulse width $t_{w1}$ of the external clock signal. Even if the pulse width $t_{w1}$ of the external clock signal is narrow, the internal clock signal can have the desired pulse width $t_{w2}$ to charge and/or maintain the high state of the word line WL (shown in FIG. 1) for accessing data stored within memory cells coupled with the word line WL.

Figure 3:
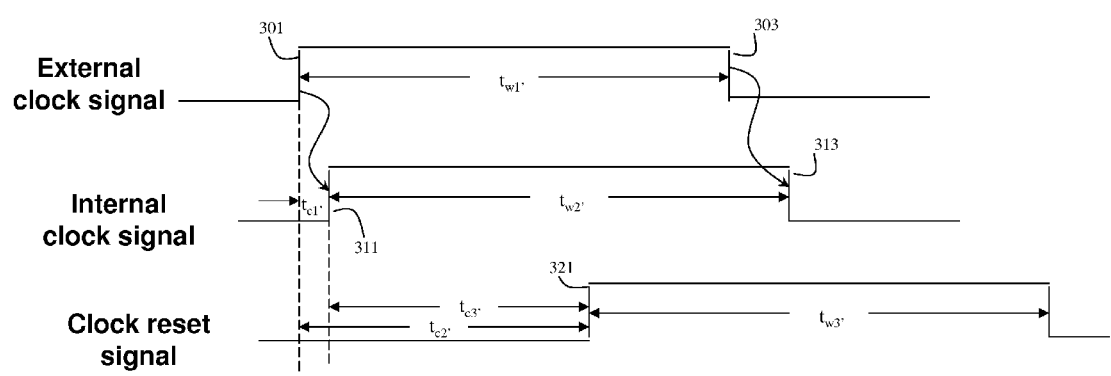
FIG. 3 is a drawing illustrating state transitions of the external clock signal, the internal clock signal, and the clock reset signal during a low-speed and/or low-voltage operation.

Following is a description regarding an exemplary low-speed operation of the clock generator 115. FIG. 3 is a schematic drawing illustrating state transitions of the external clock signal, the internal clock signal, and the clock reset signal during a low-speed and/or low-voltage operation. In FIG. 3, the external clock signal can have a pulse width $t_{w1'}$. The internal clock signal can have a pulse width $t_{w2'}$. The clock reset signal can have a pulse width $t_{w3'}$.

For some embodiments having an operating speed of about 10 MHz, the external clock signal can include a first state transition, e.g., state transition 301 from low to high, and a second state transition, e.g., state transition 303 from high to low. The pulse width $t_{w1'}$ can range from the state transition 301 to the state transition 303. The state transition 301 of the external clock signal can trigger a state transition 311 of the internal clock signal, e.g., from low to high. A time difference $t_{c1'}$ can be between the state transition 301 of the external clock signal and the state transition 311 of the internal clock signal. In some embodiments, the time difference $t_{c1'}$ can be a constant.

The clock reset signal can have a third state transition, e.g., a state transition 321 from low to high. A time period $t_{c2'}$ can range from the state transition 301 of the external clock signal to the state transition 321 of the clock reset signal. As noted, the state transition 311 of the internal clock signal and the state transition of the clock reset signal 321 can have a tracking delay time $t_{c3'}$. In embodiments, the tracking delay time $t_{c3'}$ can be a constant.

In some embodiments, the clock generator 115 can compare the pulse width $t_{w1'}$ and the time period $t_{c2'}$. As shown in FIG. 3, the pulse width $t_{w1'}$ is larger than the time period $t_{c2'}$. The state transition 303 of the external clock signal can directly or indirectly trigger a state transition 313, e.g., from high to low, of the internal clock signal for resetting the clock cycle of the internal clock signal. In some embodiments, the clock generator 115 can output the internal clock signal having a pulse width $t_{w2'}$ substantially equal to the pulse width $t_{w1'}$. Since the state transition 303 triggers the state transition 313, the pulse width $t_{w2'}$ of the internal clock signal can vary corresponding to the change of the pulse width $t_{w1'}$ of the external clock signal. In some embodiments, the pulse width $t_{w1'}$ of the external clock signal is substantially equal to the time period $t_{c2'}$ of the clock reset signal. Under these circumstances, either the state transition 303 or the state transition 321 can trigger the state transition 313.

As noted, the clock generator operates at the low speed. Since the pulse width $t_{w1'}$ is larger than the time period $t_{c2'}$, the state transition 303 of the external clock signal can trigger the state transition 313 of the internal clock signal, resetting the internal clock signal. The state transition 313 triggered by the state transition 303 can define the desired pulse width $t_{w2'}$. Since the state transitions 301 and 303 defines the pulse width $t_{w1'}$ of the external clock signal, the pulse width $t_{w2'}$ of the internal clock signal varies corresponding to the change of the pulse width $t_{w1'}$ of the external clock signal. During the low-power or low-speed operation, the internal clock signal can have the desired pulse width $t_{w2'}$ that can let the data signals stored within memory cells being sensed and/or latched before the internal clock cycle is reset.

It is found that the clock generator 115 (shown in FIG. 1) can compare the pulse width of the external clock signal and the time period, outputting the desired pulse width of the internal clock signal. At the high-speed operation, the pulse width of the internal clock signal can be determined by the time period $t_{c2}$ shown in FIG. 2. The pulse width of the internal can provide a desired time period, for example, to maintain the voltage of the word line WL high. At the low-speed operation or low voltage operation, the pulse width of the internal clock signal can be determined by the pulse width $t_{w1'}$ of the external clock signal as shown in FIG. 3. The enlarged pulse width of the internal clock signal can desirably reset the internal clock signal after data signals from the memory arrays are accessed and/or latched.

It is noted that the states and/or state transitions of the clock signals described above in conjunction with FIGS. 2-3 are merely exemplary. One of skill in the art can modify the states and/or state transitions of the clock signals to achieve a desired clock operation for accessing data stored within the memory circuit.

Figure 4:
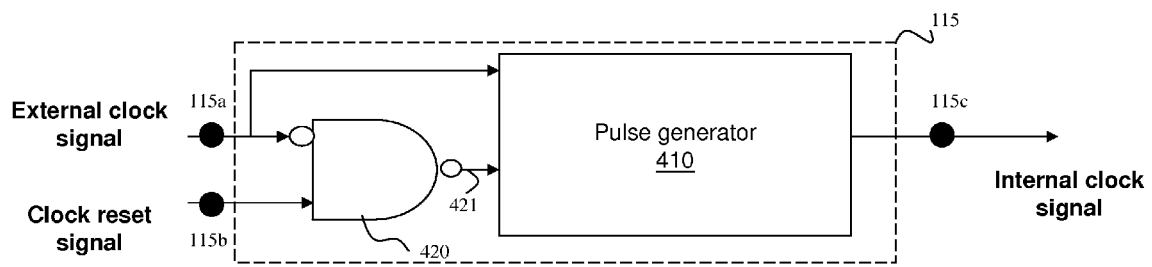
FIG. 4 is a schematic drawing illustrating an exemplary clock generator.

FIG. 4 is a schematic drawing illustrating an exemplary clock generator. As noted, the clock generator 115 can include the input ends 115a-115b and the output end 115c. In some embodiments, the clock generator 115 can include a pulse generator 410 and a comparator 420. The pulse generator 410 is capable of receiving the external clock signal. In some embodiments, the pulse generator 410 can include a latch circuit for latching a state transition of the external clock signal. The comparator 420 is capable of receiving the external clock signal and the clock reset signal for a logic operation. The comparator 420 can include a NAND circuit, NOR circuit, AND circuit, NOT circuit, OR gate, other logic gates or circuits, or any combinations thereof. The comparator 420 is capable of comparing the states of the external clock signal and the clock reset signal and generating a signal 421 for triggering the state transition 221 or 303 shown in FIGS. 2 and 3, respectively.

In some embodiments using a NAND circuit, the pulse generator 410 can receive the external clock signal. The state transition 201 or 301 of the external clock signal can trigger the state transition 211 or 311 of the internal clock signal, respectively (shown in FIGS. 2-3). The pulse generator 410 can latch the transitioning state, e.g., the high state, resulting from the state transition 201 or 301 of the internal clock signal. The comparator 420 can compare, e.g., a NAND logic operation, states of the external clock signal and the clock reset signal, generating the signal 421 at an output end of the comparator 420. For example, TABLE 1 shows an exemplary NAND operation of the comparator 420. If the signal 421 output from the comparator 420 is high, the state of the internal clock signal is not changed. If the signal 421 output from the comparator 420 is low, the signal 421 can trigger the state transition 213 or 313 of the internal clock signal, which defines the pulse width $t_{w2}$ or $t_{w2'}$ of the internal clock signal, respectively.

TABLE 1

| External clock signal | Reset clock signal | Signal 421 |
| --- | --- | --- |
| High | High | High |
| High | Low | High |
| Low | Low | High |
| Low | High | Low |

The signal 421 can be generated corresponding to the state transition 221 of the reset clock signal or the state transition 303 of the external clock signal (show in FIGS. 2-3). The signal 421 can trigger the internal clock signal transition from high to low, e.g., state transition 213 or 313.

It is noted that the comparator 410 shown in FIG. 4 is merely exemplary. Various types of the comparator 410 can be used. Furthermore, the comparator 410 can include additional diodes and/or devices as long as the comparator 410 can provide a desired logic operation for providing the signal 421.

Figure 5:
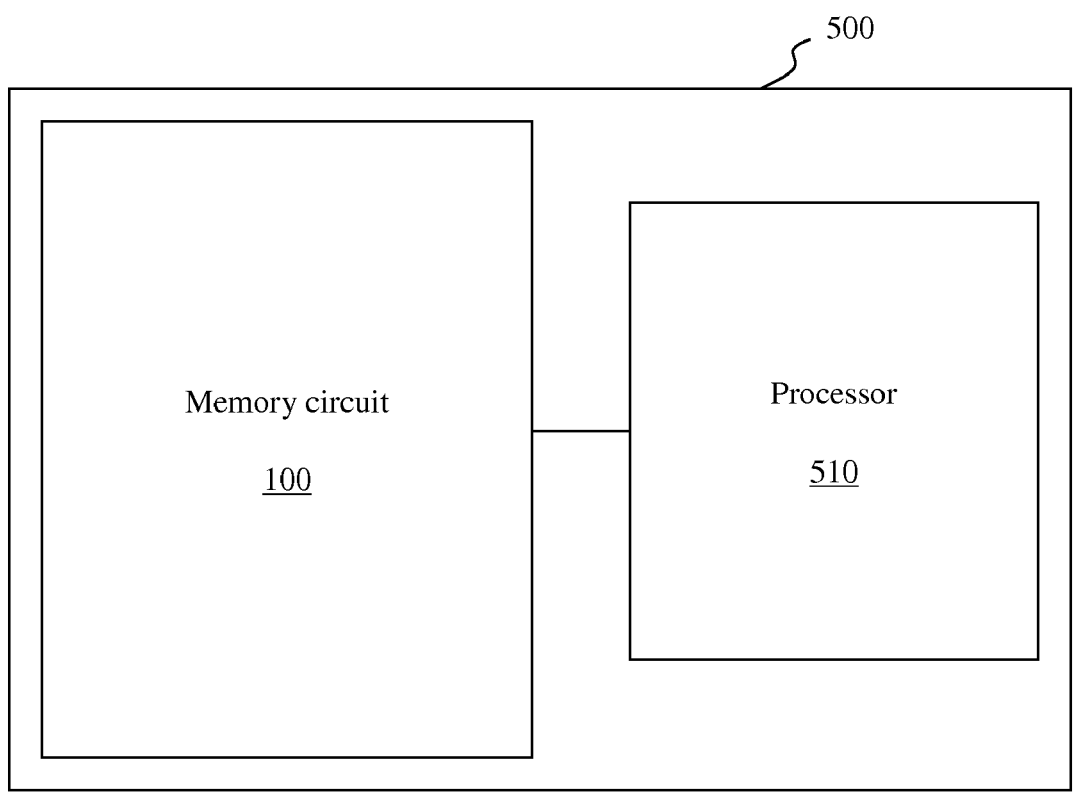
FIG. 5 is a schematic drawing showing a system including an exemplary memory circuit.

FIG. 5 is a schematic drawing showing a system including an exemplary memory circuit. In FIG. 5, a system 500 can include a processor 510 coupled with the memory circuit 100. The processor 510 is capable of accessing the data stored in the memory arrays 101a and 101b (shown in FIG. 1) of the memory circuit 100. In some embodiments, the processor 510 can be a processing unit, central processing unit, digital signal processor, or other processor that is suitable for accessing data of memory circuit.

In some embodiments, the processor 510 and the memory circuit 100 can be formed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In some embodiments, the system 500 including the memory circuit 100 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A clock generator comprising:
   a first input end, the first input end being capable of receiving a first clock signal including a first state transition and a second state transition, a first pulse width defined by the first state transition and the second state transition; and
   a second input end, the second input end being capable of receiving a second clock signal having a third state transition, a time period defined by the first state transition to the third state transition, wherein the clock generator is capable of:
      comparing the first pulse width and the time period; and
      outputting a third clock signal having a second pulse width defined by a fourth state transition and a fifth state transition, wherein the fifth state transition of the third clock signal is capable of being triggered by the second state transition of the first clock signal or the third state transition of the second clock signal depending on the comparison of the first pulse width and the time period.

2. The clock generator of claim 1, wherein the second pulse width is substantially equal to the first pulse width or the time period, whichever is larger.

3. The clock generator of claim 1, wherein the first clock signal includes an external clock signal, the second clock signal includes a clock reset signal, and the third clock signal includes an internal clock signal.

4. The clock generator of claim 3, wherein the time period includes a tracking delay time between the internal clock signal and the clock reset signal.

5. The clock generator of claim 1 further comprising:
   a pulse generator coupled with the first input end; and
   a comparator being coupled between the pulse generator and the first input end and coupled with the second input end.

6. The clock generator of claim 5, wherein the comparator is capable of comparing the first clock signal and the second clock signal, outputting a signal to the pulse generator.

7. The clock generator of claim 6, wherein the pulse generator is capable of outputting the third clock signal having the fourth state transition triggered by the first state transition of the first clock signal and having the fifth state transition triggered by the signal output from the comparator.

8. The clock generator of claim 6, wherein the comparator comprises a NAND circuit.

9. An memory circuit comprising:
   at least one memory array for storing data; and
   a control circuit, the control circuit being capable of providing at least one signal for accessing the data of the memory array, the clock generator comprising:
      a first input end, the first input end capable of receiving a first clock signal including a first state transition and a second state transition, a first pulse width being defined by the first state transition and the second state transition;
      a second input end, the second input end capable of receiving a second clock signal having a third state transition, a time period being defined by the first state transition and the third state transition; and
      an output end configured to output a third clock signal having a second pulse width defined by a fourth state transition and a fifth state transition of the third clock signal, wherein the fifth state transition of the third clock signal is triggered by the second state transition of the first clock signal if the first pulse width is larger than the time period, or by the third state transition of the second clock signal if the first pulse width is not larger than the time period.

10. The memory circuit of claim 9, wherein the second pulse width is substantially equal to the first pulse width or the time period, whichever is larger.

11. The memory circuit of claim 9, wherein the first clock signal includes an external clock signal, the second clock signal includes a clock reset signal, and the third clock signal includes an internal clock signal.

12. The memory circuit of claim 11, wherein the time period includes a tracking delay time between the internal clock signal and the clock reset signal.

13. The memory circuit of claim 9, wherein the clock generator further comprises:
   a pulse generator coupled with the first input end; and
   a comparator being coupled between the pulse generator and the first input end and coupled with the second input end, wherein the comparator is capable of comparing the first clock signal and the second clock signal, outputting a signal to the pulse generator such that the pulse generator is capable of outputting the third clock signal having the fourth state transition triggered by the first state transition of the first clock signal and having the fifth state transition triggered by the signal output from the comparator.

14. The memory circuit of claim 13, wherein the comparator comprises a NAND circuit.

15. A method for generating an internal clock signal, the method comprising:
   receiving an external clock signal including a first state transition and a second state transition, the external clock signal having a first pulse width ranging from the first state transition and the second state transition;
   receiving a clock reset signal including a third state transition, the clock reset signal having a time period ranging from the first state transition to the third state transition;
   comparing the first pulse width and the time period; and outputting the internal clock signal having a second pulse width ranging from a fourth state transition to a fifth state transition, wherein the fifth state transition of the internal clock signal is capable of being triggered by the second state transition of the external clock signal or the third state transition of the reset clock signal depending on the comparison of the first pulse width and the time period.

16. The method of claim 15, wherein the time period includes a tracking delay time between the internal clock signal and the clock reset signal.

17. The method of claim 15, wherein comparing the first pulse width and the time period comprises:
   comparing states of the external clock signal and the clock reset signal; and
   generating a signal for triggering the fifth transition of the internal clock signal.

18. The method of claim 17, wherein comparing the states of the external clock signal and the clock reset signal comprises NAND comparing the states of the external clock signal and the clock reset signal.

19. The method of claim 17, wherein outputting the internal clock signal comprises:
   triggering the fourth state transition of the internal clock signal by the first state transition of the external clock signal;
   latching a transitioning state resulting from the fourth state transition of the internal clock signal; and
   triggering the fifth state transition by the signal generated by comparing the first pulse width and the time period.

* * * * *